US007015821B2

(12) United States Patent
Gamperl et al.

(10) Patent No.: US 7,015,821 B2
(45) Date of Patent: Mar. 21, 2006

(54) EEPROM MEMORY MATRIX AND METHOD FOR SAFEGUARDING AN EEPROM MEMORY MATRIX

(75) Inventors: Susanne Gamperl, Vogach (DE); Siegfried Tscheternigg, Vilgertshofen (DE); Armin Wedel, Mering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/917,232

(22) Filed: Aug. 12, 2004

(65) Prior Publication Data

US 2005/0036383 A1 Feb. 17, 2005

Related U.S. Application Data

(63) Continuation of application No. PCT/DE03/00224, filed on Jan. 28, 2003.

(30) Foreign Application Priority Data

Feb. 14, 2002 (DE) .............................. 102 06 186

(51) Int. Cl.
*G08B 21/00* (2006.01)

(52) U.S. Cl. ..................... 340/635; 340/661; 365/222

(58) Field of Classification Search ............... 340/635, 340/661, 663, 657; 365/222, 185.17, 185.25, 365/185.21, 221, 211

See application file for complete search history.

(56) References Cited

U.S. PATENT DOCUMENTS

| 5,598,366 | A | * | 1/1997 | Kraus et al. ................. 365/145 |
| 5,909,394 | A | * | 6/1999 | Chou ..................... 365/185.21 |
| 6,058,044 | A | | 5/2000 | Sugiura et al. ........ 365/185.17 |
| 6,097,624 | A | * | 8/2000 | Chung et al. ................ 365/145 |
| 6,181,600 | B1 | * | 1/2001 | Seki et al. ............. 365/185.18 |

FOREIGN PATENT DOCUMENTS

| EP | 0 178 512 A1 | 4/1986 |
| EP | 0 479 461 A2 | 4/1992 |
| EP | 0 776 012 A2 | 5/1997 |

* cited by examiner

*Primary Examiner*—Phung T. Nguyen
(74) *Attorney, Agent, or Firm*—Darby & Darby

(57) ABSTRACT

EEPROM memory matrix in which column lines are alternatively used as detector lines. A precharge voltage is applied to selected detector lines together with the relevant column line in each case before read-out of the memory columns. If a detector line loses its precharge level during the read-out of the memory cells, light incidence is assumed and a corresponding alarm function is triggered. Preferably column lines adjacent to the column lines that are respectively selected for the data transmission are connected as detector lines.

5 Claims, 1 Drawing Sheet

EEPROM MEMORY MATRIX AND METHOD FOR SAFEGUARDING AN EEPROM MEMORY MATRIX

CROSS-REFERENCE TO RELATED APPLICATION

This application is a continuation of International Patent Application Ser. No. PCT/DE03/00224, filed Jan. 28, 2003, which published in German on Aug. 21, 2003 as WO 03/069629, and is incorporated herein by reference in its entirety.

FIELD OF THE INVENTION

The present invention relates to an EEPROM memory matrix and a method which makes it possible to safeguard the memory matrix from light attacks.

BACKGROUND OF THE INVENTION

The function of integrated semiconductor circuits can be influenced by the action of light. At pn junctions, the photon energy radiated in leads to the generation of electron-hole pairs which lead to a current flow in a closed electric circuit. When a voltage is applied to a pn junction in the reverse direction, in the absence of light being radiated in, a leakage current flows, the so-called dark current, which is very small. When light is radiated in, a significantly more intense photocurrent which is dependent on the light intensity is superposed on the dark current.

In many security-relevant IC chips (e.g. security memory ICs), lines on which confidential data are transmitted are arranged in diffusion planes within the semiconductor material, because this affords good protection against physical attacks (e.g. probing by means of emplaced contact needles). Said lines are therefore formed as strip-type doped regions in the semiconductor material. At the outer walls of these diffusion tracks, pn junctions are present toward the substrate or toward a doped well in the substrate, said pn junctions being reverse-biased in normal operation of the circuit. In the event of light incidence, leakage currents occur at said pn junctions, and influence the voltage level on the line, particularly if a dynamic (capacitive) data signal is carried there. Suitable measures can thereupon be initiated if the data transmission has not become indecipherable anyway to the attacker as a result of the voltage drop.

The easiest way of avoiding harmful effects of light attacks on security-relevant circuit parts is if there is a light detector present on the IC chip. However, it is not sufficient for such a light detector to be arranged in a locally delimited fashion since a light beam can also be focused onto security-critical circuits. Therefore, it is necessary to configure the light detector such that it is distributed extensively over the integrated circuit and is ready for use wherever the critical locations of the circuit are arranged. Strictly speaking, an effective light detector should be fitted exactly at the place of the circuit parts to be protected. However, since lines of the wiring of the circuit in different metalization planes are generally situated above the circuit part to be protected, light diffraction effects and scattering effects occur which destroy a very narrowly delimited focusing of the light beam, so that it is sufficient to arrange a light detector structure at least to some extent in the vicinity of the circuit parts to be protected.

When safeguarding an EEPROM memory matrix against light attacks, the problem arises that the lines provided for the read-out of security-critical data cover a comparatively large areal region, so that light detector structures have to be present ubiquitously there. However, light detector structures integrated into the arrangement of the memory cells of an EEPROM memory matrix considerably increase the area requirement occupied by the memory matrix.

SUMMARY OF THE INVENTION

It is an object of the present invention to specify an effective safeguarding of an EEPROM memory matrix against light attacks which does not increase the space requirement necessary on the IC chip, or increases it at most to an insignificant extent.

It is possible to integrate a light detector in the layout of the circuit of the memory matrix in such a way that it detects a light attack along a signal-carrying diffusion line. What appears to be suitable for forming such a light detector is a further diffusion line which is routed parallel to the data line to be protected and to which a precharge voltage is applied during defined clock phases in which confidential data are communicated. A logic gate which is connected to these detector lines and evaluates the voltage level of the light detector line during the corresponding clock phase outputs an alarm signal or triggers some other alarm function if the voltage on the detector line falls to an excessively low level. Such an arrangement affords sufficient protection against light attacks along the security-critical data lines.

According to the invention, the column lines of the EEPROM memory matrix that are present anyway for the read-out of the memory cells are alternatively used as detector lines. Since the EEPROM memory matrix has an areal extent which necessitates an areally extensive protection against light attacks, column lines adjacent to the column lines that are respectively selected for the data transmission are preferably connected as detector lines in order thus to safeguard the data transmission against light attacks. The precharge voltage is applied to these column lines selected as detector lines together with the column line to be read in each case before the read-out of the relevant memory column. If the detector column lines lose their precharge level during the read-out of the memory cells, light incidence is assumed and a corresponding alarm function is triggered. For this purpose, there is an evaluation unit present which comprises e.g. a logic gate to which the voltages to be evaluated are fed.

In some security ICs it is customary for data to be read out serially. Therefore, in a corresponding arrangement of the memory cells in a memory matrix, all the column lines with the exception of the column that is respectively to be read out may be used as detector lines. In the evaluation unit, the column line of that memory column which is currently being read out is in each case excluded from the evaluation. If data are read out in parallel, it is necessary to address the columns of the memory matrix in such a way that adjacent columns in the memory cell address do not lie physically next to one another, but rather that a juxtaposition of column lines of the columns to be read and detector column lines is produced.

DETAILED DESCRIPTION OF THE PREFERRED MODE OF THE INVENTION

Figure 1:
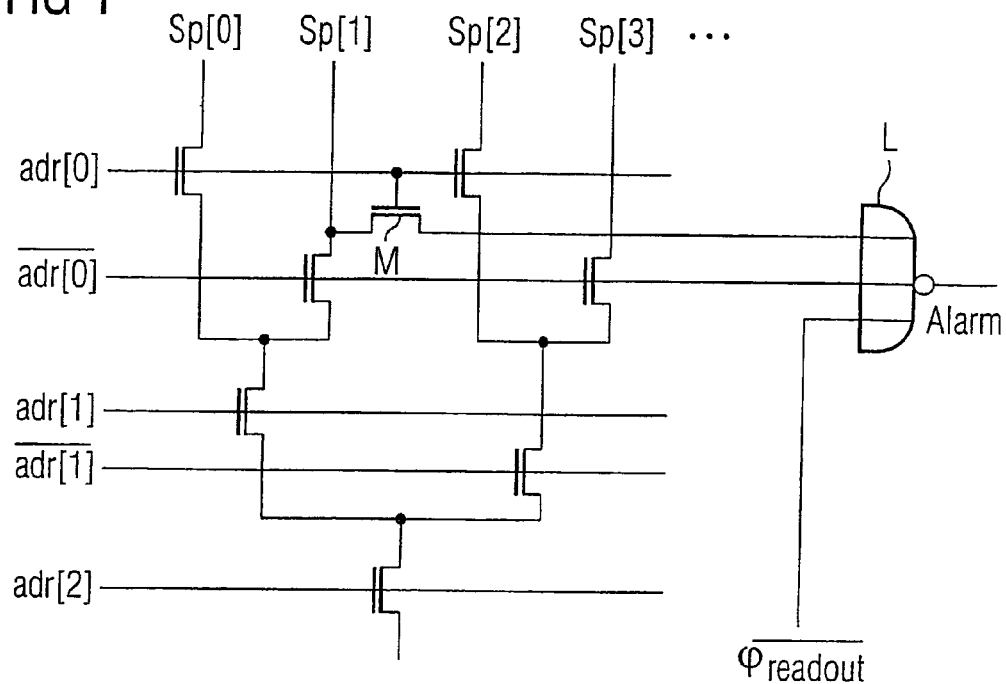
FIG. 1 illustrates a circuit diagram for a serial column decoder.

FIG. 1 illustrates a circuit diagram for a serial column decoder with column lines Sp[0], Sp[1], Sp[2], Sp[3], . . . , address lines adr[0], adr[1], adr[2], . . . and complementary address lines. The odd-numbered columns are connected as detector lines with respect to each even-numbered column which is read out. To that end, a switching transistor is in each case present as switch M which, if it is closed, that is to say in the on state, connects the relevant odd-numbered column to a logic gate L. The switching transistors, which connect the odd-numbered columns to a NOR gate L in this example, are closed by the address line adr[0] in this example; in principle, however, an arbitrary address line which is at "high" in the event of even addresses can be connected to the gate terminals of the switches M.

The switches M, only the first of which is depicted in FIG. 1, connect, in the event of a high level on adr[0], the relevant column, in this case the column Sp[1] in the example of the switch depicted, to the logic gate L, so that at least one input there is at the high precharge level. The line that is complementary to adr[0], that is to say a low level, is present at a further input of the logic gate L. During the read-out of the memory, a corresponding clock signal $\phi_{readout}$ is at a high level. The clock signal that is complementary thereto, that is to say a low level, is likewise applied to an input of the NOR gate, so that a high level is present at the output thereof during the read-out of the memory only when an erroneously low level is fed from one of the odd column lines, that is to say from one of the detector lines. In this case, it is assumed that said low level on the detector line stems from light being radiated in, and an alarm envisaged for this case is given.

In the example of FIG. 1, the column decoder transistors are embodied as NMOS transistors. In order that no level loss is incurred when switching through the voltage levels, said transistors are driven with a boosted voltage level in the address lines. With regard to a circuit design which is secure against manipulations, the lead from the column to the switching transistor M is arranged in the same layer as the column lines. The line to the logic gate may be arranged in a different layer; however, it should be provided with a shield in order to protect said line against unauthorized access.

Figure 2:
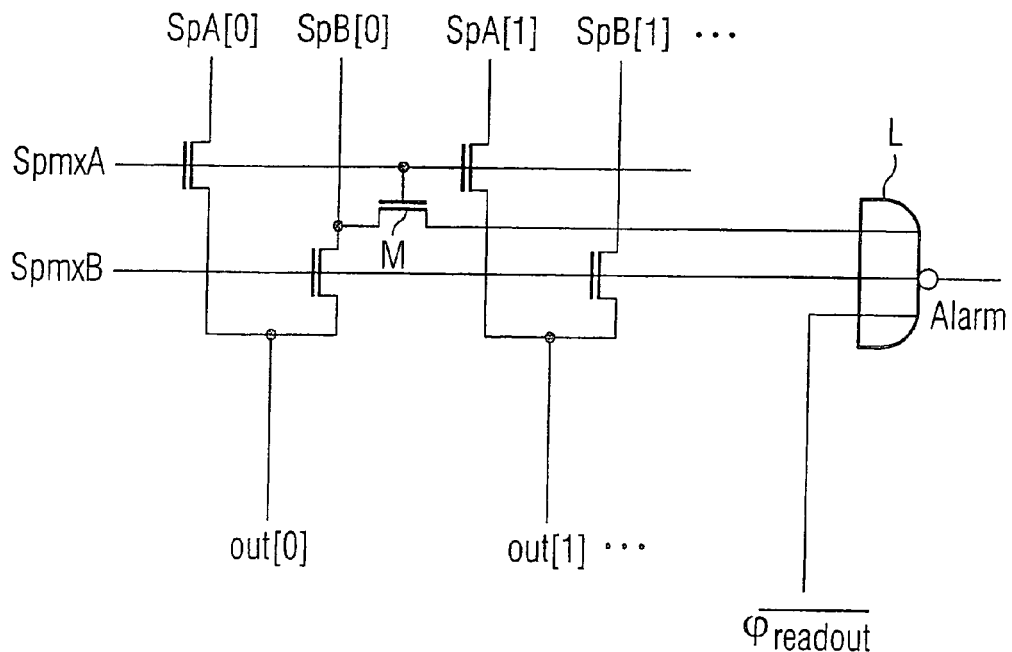
FIG. 2 illustrates a circuit diagram of a parallel column decoder.

FIG. 2 correspondingly shows a circuit diagram of a parallel column decoder. Here, too, a corresponding switching transistor is provided as switch M with respect to each column line SpB[0], SpB[1], SpB[2], SpB[3], . . . , which functions as detector line during the parallel read-out of the memory via the column lines SpA[0], SpA[1], SpA[2], SpA[3], . . . The switches M are closed via the address line SpmxA if the latter has a high level, in order to connect the column lines SpA[0], SpA[1], SpA[2], SpA[3], . . . to the outputs out[0], out[1], out[2], . . . The closed switches M connect the present detector lines SpB[0], SpB[1], SpB[2], SpB[3], . . . to the NOR gate L. The circuit shown in FIG. 2 otherwise operates in accordance with the circuit of FIG. 1.

Therefore, the invention yields an area-optimal solution to the object set for an EEPROM memory matrix with an integrated light detector. In comparison with a conventional memory matrix, all that is necessary-is-to provide a detector circuit which evaluates the column lines of the columns that are respectively not to be read with regard to their precharge level during the read-out operation.

The invention claimed is:

1. A memory matrix comprising:
   a matrix-like arrangement of memory cells;
   column lines;
   address lines; and
   switches for enabling any of the column lines that are not being used for a read-out of the memory cells to be brought to a precharge level as a detector line and to be connected to an evaluation unit,
   wherein for protection against light attacks, the evaluation unit triggers an alarm function if at least one of the detector lines lose its precharge level.

2. The memory matrix as claimed in claim 1, wherein the memory cells are arranged for a serial read-out, and the switches are connected such that all the column lines, except a colunm line selected for a respective read-out, are connected as detector lines.

3. The memory matrix as claimed in claim 1, wherein the memory cells are arranged for a parallel read-out, and
   the switches are connected such that some of the colunm lines are read-out column lines and some are detector column lines, wherein the read-out column lines and detector column lines are arranged next to one another.

4. A method for safeguarding a memory matrix having a matrix-like arrangement of memory cells, column lines, and address lines against light attacks, comprising the steps of:
   selecting column lines as detector column lines and applying a precharge voltage thereto;
   checking, during a read-out of memory cells through non-detector column lines, voltage levels on the detector column lines; and
   triggering an alarm function when a voltage level on at least one of the detector column lines falls.

5. A matrix-like arrangement of memory cells;
   column lines;
   address lines; and
   means for enabling any of the column lines that are not being used for a read-out of the memory cells to be brought to a precharge level as a detector line and to be connected to an evaluation means,
   wherein for protection against light attacks, the evaluation means triggers an alarm function if at least one of the detector lines lose its precharge level.

* * * * *

UNITED STATES PATENT AND TRADEMARK OFFICE
CERTIFICATE OF CORRECTION

PATENT NO. : 7,015,821 B2 Page 1 of 1
APPLICATION NO. : 10/917232
DATED : March 21, 2006
INVENTOR(S) : Susanne Gamperl et al.

It is certified that error appears in the above-identified patent and that said Letters Patent is hereby corrected as shown below:

*Claim 5: Column 4, line 53: delete "lose" and insert --loses--

Signed and Sealed this

Third Day of October, 2006

JON W. DUDAS
*Director of the United States Patent and Trademark Office*